United States Patent [19]

Asano et al.

[11] Patent Number: 5,173,330

[45] Date of Patent: Dec. 22, 1992

[54] PATTERNING COMPOSITION AND METHOD FOR PATTERNING ON A SUBSTRATE

[75] Inventors: Takahiro Asano, Moriguchi; Shinichi Mizuguchi, Katano; Toshio Ishikawa, Chiba, all of Japan

[73] Assignee: Matsushita Electric Industrial Co., Ltd., Kadoma, Japan

[21] Appl. No.: 503,775

[22] Filed: Apr. 3, 1990

[30] Foreign Application Priority Data

Apr. 5, 1989 [JP] Japan .................. 1-86222

[51] Int. Cl.$^5$ ................. B05D 3/06; B05D 5/12; B05D 3/02; B05D 1/18
[52] U.S. Cl. ................. 427/558; 427/96; 427/123; 427/305; 427/229; 427/443.1; 427/557; 427/553
[58] Field of Search ........ 427/53.1, 54.1, 55, 427/56.1, 96, 97, 98, 123, 304, 305, 306, 443.1, 229

[56] References Cited

U.S. PATENT DOCUMENTS

| | | | |
|---|---|---|---|
| 3,094,417 | 6/1963 | Workman | 96/28 |
| 3,094,619 | 6/1963 | Grant . | |
| 3,369,933 | 2/1968 | Shulman . | |
| 3,767,414 | 10/1973 | Huffman | 96/114.6 |
| 4,112,139 | 9/1978 | Shirk et al. | 427/54.1 |
| 4,261,800 | 4/1981 | Beckenbaugh et al. | 427/54.1 |
| 4,686,114 | 8/1987 | Halliwell et al. | 427/53.1 |
| 4,830,668 | 5/1989 | Wundt et al. | 427/304 |
| 4,832,989 | 5/1989 | Giesecke et al. | 427/304 |
| 4,847,139 | 7/1989 | Wolf et al. | 427/96 |
| 4,882,200 | 11/1989 | Liu et al. | 427/54.1 |
| 4,913,768 | 4/1990 | Wolf et al. | 427/97 |
| 4,960,613 | 10/1990 | Cole et al. | 427/53.1 |
| 5,145,714 | 9/1992 | Reisman et al. | 427/53.1 |
| 5,145,715 | 9/1992 | Asano et al. | 427/54.1 |

OTHER PUBLICATIONS

Pacansky, J., Formation of Metals by Electron Beams or UV Light From Organic Acid Salt Resists, IBM Technical Disclosure Bulletin, Aug. 1977, vol. 20, No. 3, p. 1180.

*Primary Examiner*—Shrive Beck
*Assistant Examiner*—Marianne L. Padgett
*Attorney, Agent, or Firm*—Cushman, Darby & Cushman

[57] ABSTRACT

A patterning composition is prepared by mixing a metallic salt of organic acid which separates a metal when reduced (e.g. copper (II) heptanoate), a reducing agent (e.g., 4-methoxy-1-naphthol), which shows reducing activity by being heated and loses the reducing activity by being irradiated by UV light, visible light or infrared light, gelatin and water, the composition is applied on a substrate, and the coating is irradiated by UV or visible infrared light through a mask and then heated, thereby to deposit metal in a pattern.

2 Claims, 3 Drawing Sheets

PATTERNING COMPOSITION AND METHOD FOR PATTERNING ON A SUBSTRATE

FIELD OF THE INVENTION AND RELATED ART STATEMENT

1. Field of the Invention

The present invention relates to a patterning composition and method for patterning on a substrate thereby.

2. Description of the Related Art

The conventional method for patterning on a substrate, for instance, for a hybrid IC has been made by screen-printing method on a substrate such as alumina ceramic substrate. In such conventional method, a screen which is made of silk or fine stainless wire having mask pattern thereon is placed above an alumina ceramic substrate with 0.25 mm-2.0 mm gap therebetween, and a paste containing fine grains of conductor is put thereon. And by using a squeezer, the conductive paste is squeezed on the surface of the underlying substrate through the non-masked parts of the screen. Thus a desired pattern of conductive paste layer is placed on the substrate.

As the conductive paste, improvements are made on its composition recently, and for instance, published unexamined patent application Sho 59-167096 discloses a use of a paste composition containing powders of silver salt of organic acid and fine silver powder added with a reducing agent. When UV light is radiated on this paste composition, the reducing agent in the paste reduces the silver salt of organic acid, to deposit ultra fine grains of silver which are easily sintered with fine powder of silver. Therefore, the paste composition is formed in a desired pattern by the printing method, and by combining subsequent selective UV irradiation thereon a silver-sintered conductor pattern is obtainable with a comparably low temperature heating.

Another conventional making of conductive pattern on a substrate is drawing method. The drawing method is carried out by filling a conductive paste in a pen-shaped cartridge, whose lower end is tapered to a narrow end having a small hole of 0.06 mm-2 mm at its end tip. By applying a pressure from the upper end of this cartridge on the conductive paste therein, the paste is pushed out from the small hole, and by moving this cartridge on the substrate a desired conductive pattern is drawn.

The above-mentioned conventional methods of making conductive pattern on a substrate have the following problems.

In the aforementioned screen printing method, in order to change pattern to be printed, a large printing screen must be replaced. And furthermore, even for printing the same pattern, after many times for printing, the screen inevitably spreads and makes deformation of pattern resulting in mis-registration of pattern, and therefore the screen must be replaced frequently. Furthermore when the screen is replaced, it is very difficult to accurately set the screen in a manner to manufacture very accurate and identical printed substrates without mis-registration as before, after the replacing of the screens. Therefore, for registrations of the screen at all screen replacings and parallelness adjustments of the screen as well as the substrate, very delicate and time-consuming adjustments have been necessary. For instance, generally one adjustment necessitates at least 30 minutes, and therefore manufacturing efficiency of the hybrid IC manufacturing line is lowered.

In the drawing method, the change of the desired pattern to be produced can be made only by replacing the program of driving of the cartridge. However, this method has a limit that the width of the obtainable conductive line is between about 0.06 mm through 2 mm, and its productivity is very low, since this method is fundamentally a drawing by lines.

Therefore, a purpose of the present invention is to obtain an improved highly efficient manufacturing method of the printed circuit substrate suitable for hybrid IC and a patterning composition to be used for that method.

The patterning composition in accordance with the present invention comprises:

a metallic salt of organic acid which deposits a metal when reduced and a reducing agent which shows reducing activity by being heated and loses the reducing activity by being irradiated by at least one emission selected from the group consisting of UV light, visible light and infrared light.

Method for patterning on a substrate in accordance with the present invention uses a composition containing a reducing agent which shows reducing activity by heating and loses the reducing activity by irradiation by UV light, visible light or infrared light and a composition containing a metallic salt of organic acid, or a mixture of the above two components.

According to the present invention, the metallic salt of the organic acid is reduced by the reducing agent, and thereby metal is deposited on selected patterned parts on the substrate, thereby forming the wiring pattern.

It will be recognized that some or all of the Figures are schematic representations for purposes of illustration and do not necessarily depict the actual relative sizes or locations of the elements shown.

DESCRIPTION OF THE PREFERRED EMBODIMENT

Hereafter, preferred embodiments are elucidated with reference to the accompanying drawings, FIG. 1 through FIG. 4.

First embodiment

In the first embodiment, a composition mixture is prepared comprising a metallic salt of organic acid which deposits a metal when reduced and a reducing agent which shows reducing activity when heated and loses the reducing activity when irradiated by at least one emission of UV light, visible light or infrared light. The composition is applied on a substrate, and by subsequent irradiation of the UV light, visible light or infrared light on selected parts of the coating of the composition, the irradiated parts of the composition lose the reducing activity. Therefore, when the substrate with the coating is thereafter heated, the irradiated parts of the metallic salt of the organic acid are not reduced. As a result, only the selected parts of the metallic slat which are not irradiated by the light are reduced, to produce metal of a desired pattern on the substrate.

Figure 1A:
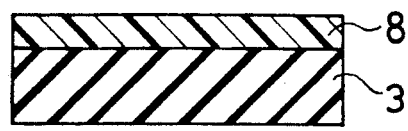
FIGS 1(A), 1(B), and 1(C) are flow drawings showing a manufacturing process of the first embodiment of the present invention.
Figure 1B:
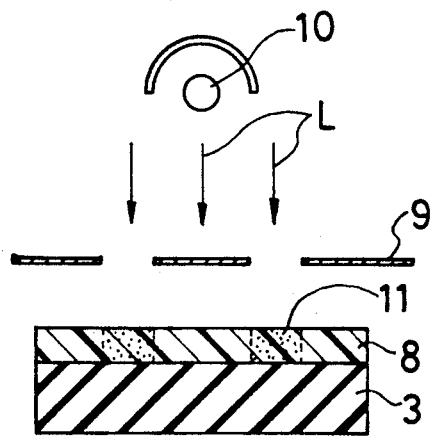
Figure 1C:
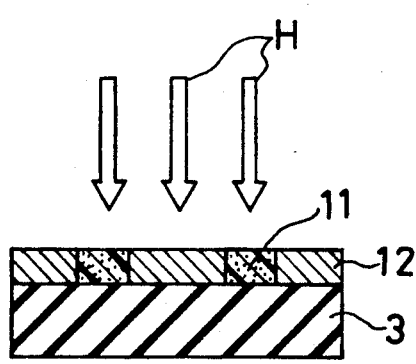

The detail of the first embodiment of manufacturing the substrate is as follows. First, on a substrate 3, a coating 8 of photosensitive composition is applied as shown in FIG. 1(A). The photosensitive composition is prepared by mixing 15 g of 4-methoxy-1-naphthol as photosensitive reducing agent, and 25 g of copper (II) heptanoate as metallic salt of organic acid, 100 g of gelatin and 1 liter of water well in a bowl. The compound was applied on a substrate to form a photosensitive composition coating 8 with a thickness of about 100 μm. Next, through a metal mask 9 which has a negative pattern in relation to the pattern to be formed as conductive pattern on the substrate 3 UV rays by a high pressure mercury lamp 10 as UV ray source is radiated on the photosensitive composition coating 8 for 1 minute. In general, an α-naphthol derivative is easily decomposed when radiated by UV light, and shows a reducing property when heated. Therefore the 4-methoxy-1-naphthol existing at the parts 11 radiated by the UV light decomposes, but is not decomposed at the parts masked from the UV light by the metal mask 9 and remains there unchanged (as shown in FIG. 1(B)). Thereafter, by applying 80° C. heating on the coating 8 for 5 minutes, the copper (II) heptanoate in the parts where the 4-methoxy-1-naphthol exist causes the deposit of copper. Thereby, a conductive pattern 12 of copper having a negative pattern with respect to the mask 9 is formed on the substrate (as shown in FIG. 1(C)).

Figure 2:
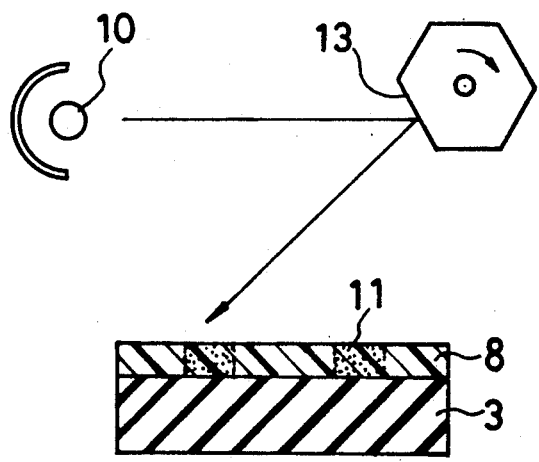
FIG. 2 is a schematic view showing a modified example of FIG. 1.

FIG. 2 shows a modified example, wherein in place of using the mask 9, the UV light is selectively radiated on the substrate 3 by scanning the beam of the UV light by utilizing a known light scanning device such as a revolving polygonal mirror.

In place of the copper (II) heptanoate as the metallic salt of organic acid, other metallic salts of organic acid, which are represented as RCOOM, (RCOO).(R'COO)M, or (RCOO).(R'COO).(R"COO)M, wherein R, R' and R" are alkyl group and aryl group, M is a metal selected from the group consisting of Ag, Fe, Co, Pb and Ni, may be used, to separate the metal of Cu as well as Ag, Fe, CO, Pb, Ni etc. And, other compounds such as α-naphthol derivative may be used as the reducing agent, besides the 4-methoxy-1-naphthol.

Second embodiment

A second embodiment of the present invention is elucidated with reference to FIG. 3.

According to the second embodiment: a second coating of a second composition, which contains a reducing agent showing its reducing activity when heated and losing its reducing activity when irradiated by emission of UV light, visible light or infrared light, is applied on a holder; on the other hand, a first coating of a first composition, which contains a metallic salt of organic acid which deposits a metal when reduced, is applied on a substrate; at least one of UV light, visible light and infrared light is irradiated on selected parts of said second coating, to form patterned activated reducing agent; thereafter surface of the irradiated second coating is contacted with surface of the first coating; and thereafter heat is applied to the contacting surfaces of the first coating and the second coating, thereby to carry out reduction of the metallic salt and form a patterned deposited metal layer on the substrate.

According to the above-mentioned second embodiment, density of the metallic salt of the organic acid in the coating is higher than the coating in the case of the first embodiment, wherein the coating composition comprises both the metallic salt and the photosensitive reducing agent mixed together. Therefore, a metal pattern of higher integration for the conductor wiring is obtainable in this embodiment.

Figure 3A:
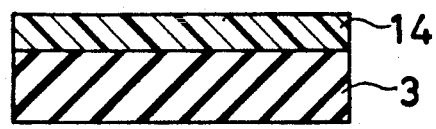
FIGS. 3(A), 3(B), 3(C), 3(D), and 3(E) are flow drawings showing a manufacturing process of a second embodiment of the present invention.
Figure 3B:
Figure 3C:
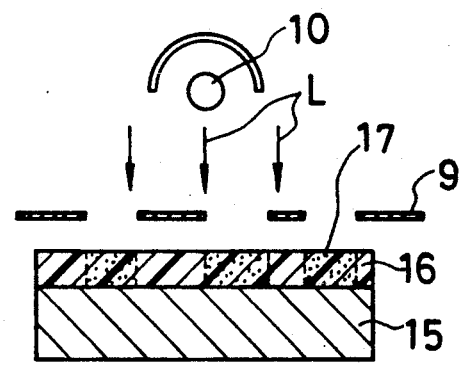

Details of the second embodiment of manufacturing the patterned substrate is as follows. First, on a substrate 3, a first coating 14 of a first composition containing metallic salt of organic acid is formed by applying the first composition (as shown in FIG. 3(A)).

Figure 3D:
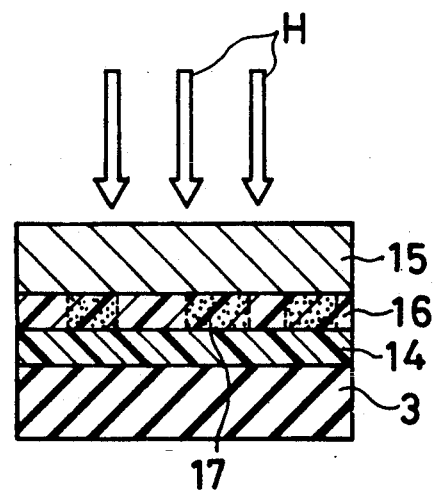
Figure 3E:
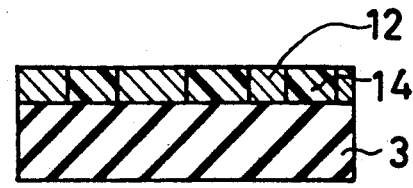

The first composition is prepared by mixing 46.7 g of copper (II) heptanoate as metallic salt of organic acid, 100 g of gelatin and 1 liter of water well in a bowl. Next, on a holder 15, a second coating 16 of photosensitive reducing agent is formed by applying the second composition containing the photosensitive reducing agent (FIG. 3(B)). The second composition is prepared by mixing 24.4 g of 4-methoxy-1-naphthol, 100 g of gelatin and 1 liter of water well in a bowl. The second coating, i.e., a photosensitive reducing film 16 is irradiated by a UV light from a high pressure mercury lamp 10 through a metal mask 9, which has a negative pattern in relation to the pattern to be formed as conductive pattern on the substrate 3, for a time period of 1 minute, thereby to form decomposed parts where the photosensitive reducing agent 4-methoxy-1-naphthol is decomposed. Next, surface of the second coating 16, i.e., the UV-irradiated and patterned photosensitive reducing coating and the surface of the first coating 14, which contains the metallic salt of organic acid, are made to contact each other, and are heated at 80° C. for 5 minutes. Then the first coating 14 at the non-UV exposed parts, which are not irradiated by the UV light, deposits copper (as shown in FIG. 3(D)). As the final step, the holder 15 is removed by known method, thereby to form the copper pattern 12 on the substrate 3.

In place of the copper (II) heptanoate as the metallic salt of organic acid, other metallic salts of organic acid, which are represented as RCOOM, (RCOO).(R'COO)M, or (RCOO).(R'COO).(R"COO)M, wherein R, R' and R" are alkyl group, and aryl group, M is a metal selected from the group consisting of Ag, Fe, Co, Pb and Ni, may be used, to deposit the metal of CU as well as Ag, Fe, Co, Pb, Ni etc. And, other compounds such as α-naphthol derivative may be used as the reducing agent, besides the 4-methoxy-1-naphthol.

As a modification, in place of using the mask 9, the UV light is selectively irradiated on the substrate 3 by scanning the beam of the UV light by utilizing a known light scanning device such as a revolving polygonal mirror.

Third embodiment

A third embodiment of the present invention is elucidated with reference to FIG. 4.

According to the third embodiment, on one face of a transparent holder as second coating of a second composition, which contains a reducing agent showing its reducing activity when heated and losing its reducing activity when radiated by emission of UV light, visible light or infrared light, is applied; on the other hand, a first coating of a first composition, which contains a metallic salt of organic acid which deposits a metal when reduced, is applied on a substrate; then the surface of the first coating is contacted with the surface of the second coating; thereafter, at least one of UV light, visible light and infrared light is irradiated from the other face, i.e., rear face of the transparent holder through the transparent holder onto the face of the second coating of the second composition to form patterned activated reducing agent; and thereafter heat is applied to the contacting faces of the first coating and the second coating, thereby to carry out reducing of the metallic salt and form a patterned deposited metal layer on the substrate.

According to above-mentioned third embodiment, density of the metallic salt of the organic acid in the second coating is higher than the coating in the case of the first embodiment, wherein the coating composition comprises both the metallic salt and the photosensitive reducing agent mixed together. Therefore, a metal pattern of higher integration for the conductor wiring is obtainable by this embodiment.

Figure 4A:
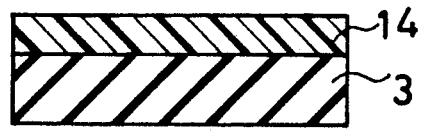
FIGS 4(A), 4(B), 4(D), and 4(E) are flow drawings showing a manufacturing process of the third embodiment of the present invention.
Figure 4B:
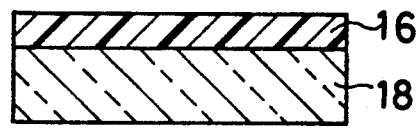
Figure 4C:
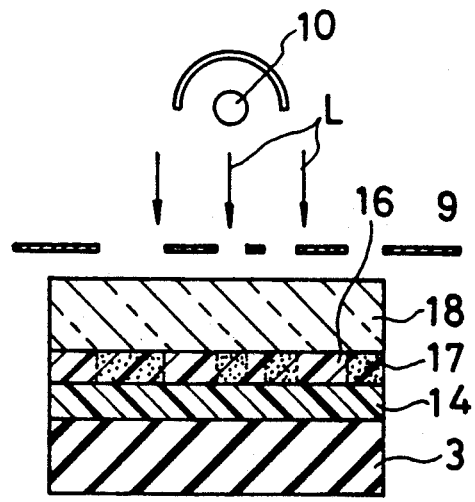
Figure 4D:
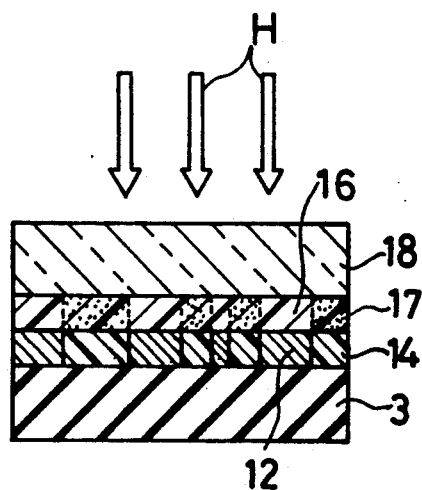
Figure 4E:
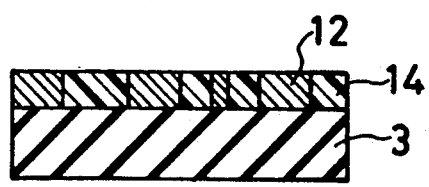

Details of the third embodiment of manufacturing the patterned substrate is as follows. First, on a substrate 3 a first coating 14 of a first composition containing metallic salt of organic acid is formed by applying the first composition (as shown in FIG. 4(A)). The first composition is prepared by mixing 46.7 g of copper (II) heptanoate as metallic salt of organic acid, 100 g of gelatin and 1 liter well in a bowl. Next, on a transparent holder 18, a second coating 16 of photosensitive reducing agent is formed by applying the second composition containing the photosensitive reducing agent (FIG. 3(B)). The second composition is prepared by mixing 24.4 g of 4-methoxy-1-naphthol, 100 g of gelatin and 1 liter of water well in a bowl. Next, surface of the second coating 16, i.e., the photosensitive reducing coating and the surface of the first coating 14, which contains the metallic salt of organic acid, contacted with each other.

Then the second coating, i.e., a photosensitive reducing film 16 is irradiated by a UV light from a high pressure mercury lamp 10 through a metal mask 9, which has a negative pattern in relation to the pattern to be formed as conductive pattern on the substrate 3, from the free side, i.e., rear face of the transparent holder 18 therethrough for a time period of 1 minute. Thereby, decomposed parts where the photosensitive reducing agent 4-methoxy-1-naphthol is decomposed, is formed. Thereafter a heat of 80° C. is applied them for 5 minutes. Then the first coating 14 at the non-UV exposed parts, which are not irradiated by the UV light, separates copper (as shown in FIG. 3(D)). As the final step, the holder 15 is removed by known method, thereby to form the copper pattern 12 on the substrate 3.

In pace of the copper (II) heptanoate as the metallic salt of organic acid, other metallic salts of organic acid, which are represented as RCOOM, (ROO).(R'COO)M, or (RCOO).(R'COO).(R"COO)M, wherein R, R' and R" are alkyl group, and aryl group, M is a metal selected from the group consisting of Ag, Fe, Co, Pb and Ni, may be used, to separate the metal of Cu as well as Ag, Fe, Co, Pb, Ni etc. And, other compounds such as α-naphthol derivatives may be used as the reducing agent, besides the 4-methoxy-1-naphthol.

As a modification, in place of using the mask 9, the UV light is selectively radiated on the substrate 3 by scanning the beam of the UV light by utilizing a known light scanning device such as a revolving polygonal mirror.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. Method for patterning on a substrate comprising the steps of:

applying on a holder a second coating of composition containing 4-methoxy-1-naphthol as a reducing agent which shows reducing activity by being heated and loss of said reducing activity by being irradiated by at least one emission selected from the group consisting of UV light, visible light and infrared light, applying on a substrate a first coating of composition containing copper (II) heptanoate as a metallic salt of organic acid, wherein said copper (II) heptanoate deposits a metal when reduced, irradiating through a metal mask with at least one of UV light, visible light and infrared light said second coating thereby to form patterned activated reducing agent, thereafter contacting a surface of said irradiated second coating with a surface of said first coating, and applying heat to contacting surfaces of said first coating and said second coating, to cause reduction of said copper (II) heptanoate, thereby to produce a patterned deposited metal layer on said substrate.

2. Method for patterning on a substrate comprising the steps of:

applying a second coating of composition containing 4-methoxy-1-naphthol as a reducing agent which shows reducing activity by being heated and loss of said reducing activity by being irradiated by at least one emission selected from the group consisting of UV light, visible light and infrared light, on a first face of a planar holder which is transparent for said light, applying a first coating of composition containing copper (II) heptanoate as a metallic salt of organic acid, wherein said copper (II) heptanoate deposits a metal on a substrate when reduced, contacting a surface of said first coating with a surface of said second coating, irradiating through a metal mask with at least one of UV light, visible light and infrared light said second coating from a second face, opposite said first face, of said planar holder, and applying heat to contacting surfaces of said first coating and said second coating, to cause reduction of said copper (II) heptanoate, thereby to produce a patterned deposited metal layer on said substrate.

* * * * *